United States Patent [19]
Hashimoto

[11] Patent Number: 5,214,606
[45] Date of Patent: May 25, 1993

[54] NON-VOLATILE SEMICONDUCTOR MEMORY AND METHOD FOR DRIVING THE SAME

[75] Inventor: Kiyokazu Hashimoto, Tokyo, Japan

[73] Assignee: NEC Corporation, Tokyo, Japan

[21] Appl. No.: 731,335

[22] Filed: Jul. 17, 1991

[30] Foreign Application Priority Data

Jul. 17, 1990 [JP] Japan .................................. 2-189218

[51] Int. Cl.$^5$ ........................ G11C 7/00; G11C 11/00
[52] U.S. Cl. .................................. 365/218; 365/185;
365/230.06
[58] Field of Search .................... 365/185, 218, 230.06,
365/104, 201, 208, 212

[56] References Cited

U.S. PATENT DOCUMENTS

| | | | |
|---|---|---|---|
| 4,737,936 | 4/1988 | Takeuchi ...................... | 365/185 X |
| 4,823,318 | 4/1989 | D'Arrigo et al. ............... | 365/185 X |
| 4,860,261 | 8/1989 | Kreifels et al. ................ | 365/218 |
| 5,053,990 | 10/1991 | Kreifels et al. ................ | 365/218 |

*Primary Examiner*—Robert J. Pascal
*Assistant Examiner*—Seung Ham
*Attorney, Agent, or Firm*—Leydig, Voit & Mayer

[57] ABSTRACT

In a flash type EEPROM comprising a memory cell matrix, an X decoder and a Y decoder, the X decoder includes a first circuit for charging an output of the first circuit to a voltage supply voltage when the first circuit is selected by an address signal, a depletion N-channel MOS transistor connected between the output node of the first circuit and a corresponding word line and having a gate connected to receive a control voltage, a second circuit for generating a high voltage at an output node of the second circuit at the time of a write mode, and a enhancement P-channel MOS transistor connected between the output node of the second circuit and the corresponding word line and having a gate connected to receive an erase verify signal. In an erase voltage verify mode, the gate of the depletion N-channel transistor is brought to a low level and the enhancement P-channel MOS transistor is turned off, so that a selected word lines is charged through the depletion N-channel MOS transistor. Accordingly, a voltage of the selected word line is set to a level lower than the voltage supply voltage.

3 Claims, 7 Drawing Sheets

NON-VOLATILE SEMICONDUCTOR MEMORY AND METHOD FOR DRIVING THE SAME

BACKGROUND OF THE INVENTION

1. Field of the Invention

The present invention relates to an electrically erasable programmable non-volatile semiconductor memory (called "EEPROM" in the specification) and a method for driving the EEPROM. More specifically, the present invention relates to a flash type EEPROM in which all contents of the EEPROM can be simultaneously erased, and a method for driving the flash type EEPROM.

2. Description of Related Art

In general, flash type EEPROMs have an erase mode, a write mode and a read mode. In the erase mode, all memory cells are simultaneously erased. However, the memory cells in the EEPROM have dispersion in a gate length and in a gate oxide thickness, and consequently, dispersion in a memory cell erasing speed. In other words, the flash type EEPROM has a substantial difference in the erasing speed between a memory cell having the fastest erasing speed and another memory cell having the slowest erasing speed. On the other hand, an erasing time $t_{PE}$ is determined by a pulse width of an erasing signal. Therefore, this pulse width of the erasing signal is set to fulfil the following conditions:

(1) In the erased condition, the memory cell having the fastest erasing speed has a threshold voltage higher than 0 V, and (2) In the erased condition, the memory cell having the slowest erasing speed has a threshold voltage lower than 3 V.

The reason for the condition (1) is that: if the erased memory cell has the threshold voltage lower than 0 V (this condition is called a "excess erase"), the excess erased memory cell is turned on in the read mode without exception even if it is not selected. Therefore, it becomes impossible to read the memory cells.

On the other hand, the reason for the condition (2) is that: a standard range of the voltage supply voltage Vcc for the flash type EEPROM in the operating condition is ordinarily 5 V±0.5 V. Therefore, in order to obtain a cell current Ion required for stably reading the erase memory cell, it is necessary to fulfil a condition of $V_{TM}(E) \leqq 3$ V.

Therefore, the erasing time is set to ensure that the dispersion of the threshold in all the erased memory cells is required to be in the range of greater than 0 V but less than 3 V. If the erasing time is too short, the threshold of the erased memory cell does not becomes less than 3 V. If the erasing time is too long, the threshold of some erased memory cell would become less than 0 V.

Thus, an erase verify mode has been provided in the flash type EEPROM in order to set the erasing time optimized to the memory cells. After the erasing has been completed, the EEPROM is put in the erase verify mode, and all the memory cells are sequentially read out in order to check whether or not each of the memory cell fulfils the above mentioned condition (1).

For this purpose, the conventional flash type EEPROM has included a circuit for generating an erase verify voltage such as 3 V, and a voltage switching circuit having a pump-up circuit for supplying a pumped-up voltage in the writing mode and in the erase mode, the voltage supply voltage in the read mode and the erase verify voltage in the erase verify mode. For the purpose of generating the erase verify voltage, the erase verify voltage generating circuit is connected to receive a reference voltage supplied from a reference voltage generating circuit. For example, this reference voltage generating circuit is composed of one P-channel enhancement MOS transistor and first, second and third N-channel enhancement MOS transistors connected in series, each of the MOS transistors being connected in the form of active load in which a gate and a drain of each N-channel enhancement MOS transistor are short-circuited, and a gate of the P-channel enhancement MOS transistor is grounded. A source of the P-channel enhandcement MOS transistor is connected to a voltage supply voltage, and a drain of the P-channel enhancement MOS transistor is connected to a drain of the first N-channel enhancement MOS transistor. A source of the third N-channel enhancement MOS transistor is grounded. A connection node between the drain of the P-channel enhancement MOS transistor and the drain of the first N-channel enhancement MOS transistor gives the reference voltage Vref. Therefore, assuming that all the N-channel enhancement MOS transistors have the same threshold $V_{TN}$, the reference voltage Vref is given by $3 \cdot V_{TN}$. Namely, if each of the three N-channel enhancement MOS transistor has the threshold $V_{TN}$ of 1 V, the reference voltage of 3 V is given. On the basis of this reference voltage, the erase verify voltage having a large current capacity is generated.

In order to precisely verify the threshold of the erased memory cell, the erase verify voltage and hence the reference voltage are required to be stable against variations of process parameters, fluctuation of the voltage supply voltage and a temperature variation.

However, the above mentioned reference voltage generating circuit is disadvantageous in that if the threshold $V_{TN}$ varies by $\Delta V_{TN}$, the reference voltage Vref inevitably varies by $3 \cdot \Delta V_{TN}$. For example, if the threshold $V_{TN}$ varies from 1.0 V to 1.2 V due to variation of process parameters, the reference voltage Vref varies from 3.0 V to 3.6 V. In this case, if one memory cell has the threshold of 3.5 V after completion of the erasing operation, when the memory cell having the threshold of 3.5 V is verified in the erase verify mode, it is discriminated that the erase of the memory cell having the threshold of 3.5 V has duly been completed. Therefore, when the memory cell having the threshold of 3.5 V is read in the reading mode, the cell current $I_{ON}$ of the memory cell having the threshold of 3.5 V is lower than a designed value, and therefore, a reading speed becomes slow.

When the threshold voltage $V_{TN}$ is lowered due to a drop of the temperature, a similar disadvantage is encountered.

As mentioned above, in the conventional flash type EEPROM, since the erase verify voltage is determined by the output voltage of the reference voltage generating circuit provided in the same chip, it is difficult to generate the erase verify voltage stable against variations of process parameters, fluctuation of the voltage supply voltage and a temperature variation. Therefore, the erase verify voltage has inevitably varied due to the variations of process parameters, the fluctuation of the voltage supply voltage and the temperature variation. As a result, it has not been possible to precisely detect whether or not the threshold voltage $V_{TN}$ of the erased memory cell is less than a desired erase verify voltage $V_{EV}$.

In order to obtain the erase verify voltage stable against variations of process parameters, fluctuation of the voltage supply voltage and a temperature variation, the prior art has no way other than (1) to make the reference voltage generating circuit complicated or large in the circuit scale, or to use bipolar transistors which inevitably make the manufacturing process complicated.

SUMMARY OF THE INVENTION

Accordingly, it is an object of the present invention to provide a non-volatile semiconductor memory which has overcome the above mentioned defect of the conventional one.

Another object of the present invention is to provide a non-volatile semiconductor memory capable of obtaining a stable erase verify voltage, and therefore, of precisely detecting whether or not the threshold voltage $V_{TN}$ of the erased memory cell is less than a desired erase verify voltage $V_{EV}$.

The above and other objects of the present invention are achieved in accordance with the present invention by a non-volatile semiconductor memory comprising a memory cell matrix composed of plurality of memory array including a number of memory cells having a floating gate, the memory cell matrix also including a plurality of word lines and a plurality of digit lines, an X decoder receiving a portion of an address for selecting one of the word lines, and a Y decoder receiving another portion of the address for selecting one of the digit lines, the X decoder including a first circuit for charging an output of the first circuit to a voltage supply voltage when the first circuit is selected by the address, a first MOS transistor of the depletion type connected between the output node of the first circuit and a corresponding word line and having a gate connected to receive a control voltage, a second circuit for generating a high voltage at an output node of the second circuit at the time of a write mode, and a second MOS transistor of the enhancement type connected between the output node of the second circuit and the corresponding word line and having a gate connected to receive an erase verify signal.

Preferably, the first MOS transistor is of the N-channel type and the second MOS transistor is of the P-channel type.

According to another aspect of the present invention, there is provided a method for driving the above mentioned non-volatile semiconductor memory, characterized in that, in an erase voltage verify mode, the gate of the first MOS transistor is brought to a low level and the second MOS transistor is put in an off condition, so that a selected word lines is charged through the first MOS transistor, whereby a voltage of the selected word line is set to a level lower than the voltage supply voltage.

With the above mentioned arrangement, in the erase verify mode, the word line is charged from the voltage supply voltage through the first MOS transistor of the depletion type (NE-MOST) having the gate brought to the low level. Therefore, the word line can be set to a desired voltage lower than the voltage supply voltage (for example, the erase verify voltage 3 V) so that the reading is performed.

In this case, the voltage of the word line becomes equal to a threshold $V_{TD1}$ of the NE-MOST. This threshold $V_{TD1}$ of the NE-MOST is determined by physical parameters which determine the structure of the NE-MOST. Therefore, the threshold $V_{TD1}$ of the NE-MOST is very stable against the process parameters, and only slightly changes by temperature variation.

Therefore, a stable erase verify voltage can be obtained, and accordingly, it is possible to increase the precision of the erased memory cell threshold detection. In addition, the complicated circuit for generating the erase verify voltage, which has been required in the prior art, becomes unnecessary, and therefore, the EEPROM can be simplified.

The above and other objects, features and advantages of the present invention will be apparent from the following description of preferred embodiments of the invention with reference to the accompanying drawings.

DESCRIPTION OF THE PREFERRED EMBODIMENTS

Figure 1:
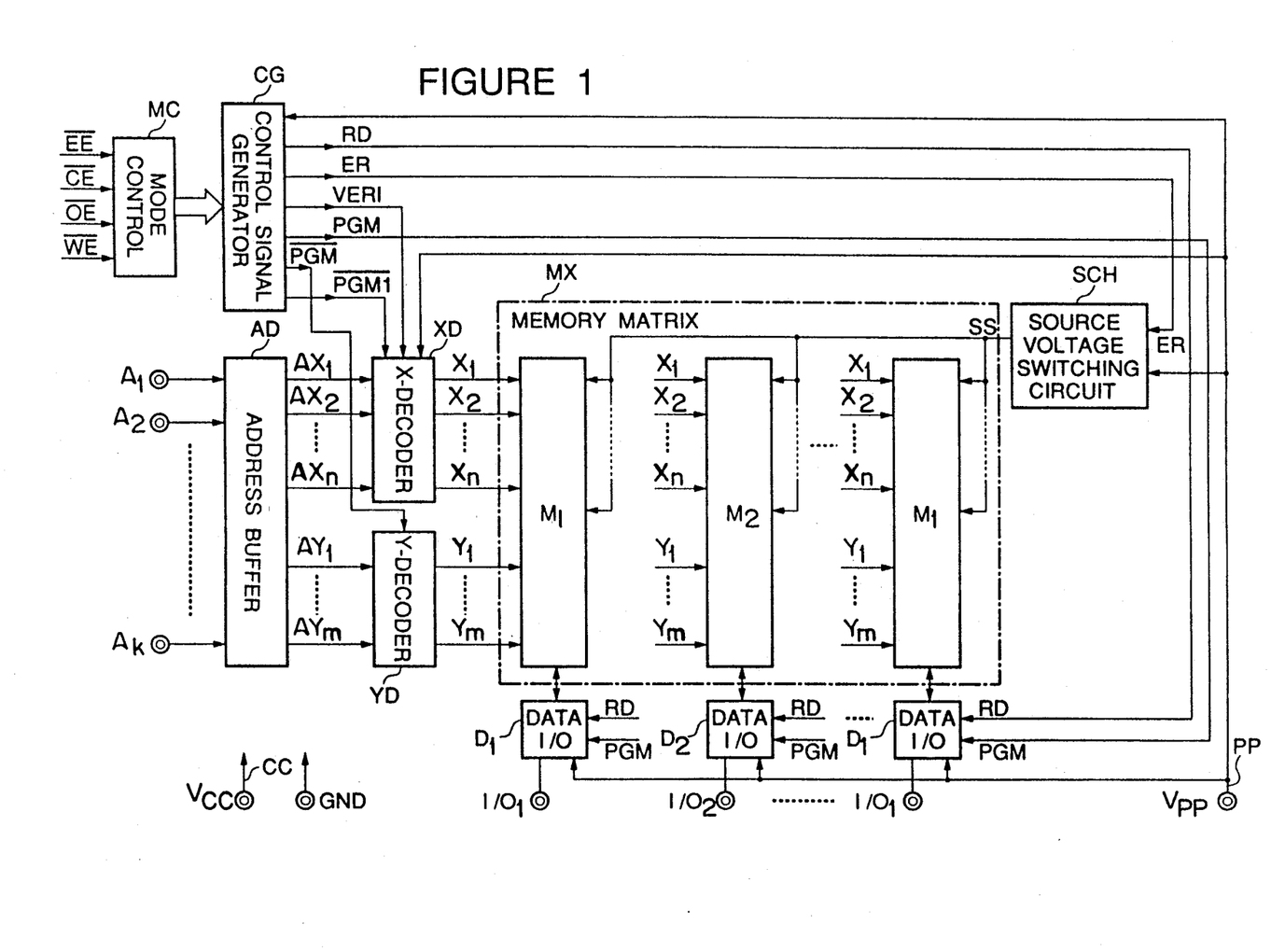
FIG. 1 is a block diagram of a first embodiment of the nonvolatile semiconductor memory in accordance with the present invention.

Referring to FIG. 1, there is shown a block diagram of a first embodiment of the nonvolatile semiconductor memory in accordance with the present invention. The shown nonvolatile semiconductor memory is a flash EEPROM.

The flash EEPROM includes a mode control circuit MC, which receives external signals CE, $\overline{WE}$, OE, and $\overline{EE}$ supplied from an input buffer (not shown). On the basis of a logical combination of the external control signals CE, $\overline{WE}$, OE, and $\overline{EE}$, the mode control circuit MC controls a control signal generator CG to cause it to generate necessary control signals for the purpose of controlling various circuit explained hereinafter. The flash EEPROM also includes an address buffer AD connected to address terminals $A_1, A_2, \ldots A_k$ so as to receive an address through the address terminals $A_1, A_2, \ldots A_k$. This address buffer AD generates address signals $AX_1, AX_2, \ldots AX_n$, and $AY_1, \ldots AY_m$. The address signals $AX_1, AX_2, \ldots AX_n$ are supplied to an X decoder XD, so that the X decoder selects a desired one of word lines $X_1, X_2, \ldots X_n$. The address signals $AY_1, \ldots AY_m$ are supplied to a Y decoder YD, so that the Y decoder selects a desired one of Y-select lines or data lines $Y_1, \ldots X_m$.

A memory cell matrix MX includes a plurality of memory arrays $M_1, M_2, \ldots M_l$, each of which is connected to all the word lines $X_1, X_2, \ldots X_n$ and all the data lines $Y_1, \ldots Y_m$, and has a data input/output connected to a corresponding one of data input/output circuits $D_1, D_2, \ldots D_l$. These data input/output circuits $D_1, D_2, \ldots D_l$ are connected to data input/output terminals $I/O_1, I/O_2, \ldots I/O_l$, respectively. Therefore, when data is read, each of the data input/output circuits $D_1, D_2, \ldots D_l$ reads out data stored in a memory cell within the corresponding memory array selected by the X decoder XD and the Y decoder YD, and outputs the read-out data to the corresponding input/output terminal. When data is written, each of the data input/output circuits $D_1, D_2, \ldots D_l$ receives data supplied from the corresponding input/output terminal, and writes the received data to the memory cell within the corresponding memory array selected by the X decoder XD and the Y decoder YD.

The shown EEPROM also includes a source voltage switching circuit SCH having a terminal SS connected to common sources of the memory cells in each of the memory arrays so as to supply a source voltage in common to the sources of all the memory cells. Furthermore, the shown EEPROM includes a voltage supply terminal Vcc, which is connected through a line CC to various terminals explained hereinafter, and a high voltage terminal Vpp for supplying a high voltage required for the writing and erasing of the memory cells. This high voltage terminal Vpp is connected through a line PP to the data input/output circuits $D_1, D_2, \ldots D_l$, the source voltage switching circuit SCH, the X decoder XD, and the control signal generator CG. "GND" shows a ground terminal.

The control signal generator CG outputs a read signal RD and a write signal PGM to the data input/output circuits $D_1, D_2, \ldots D_l$, and also supplies an erase signal ER to the source voltage switching circuit SCH. Furthermore, the control signal generator CG outputs an erase verify signal VERI and a write signal $\overline{PGM1}$ to the X decoder XD, and a write signal $\overline{PGM}$ to the Y decoder YD.

The following table shows a relation between various modes and the signals the external control signals CE, $\overline{WE}$, OE, and $\overline{EE}$, the terminal Vpp and the input/output terminals I/Oi.

TABLE 1

| | CE | OE | $\overline{WE}$ | $\overline{EE}$ | Vpp | I/Oi |
|---|---|---|---|---|---|---|
| Reading | L | L | H | H | Vcc | Date Output |
| Writing | L | H | L | H | Vpp | Date Input |
| Erasing | L | H | L | L | Vpp | Date Input (FF) |
| Erase Verify | L | L | H | L | Vpp | Date Output |

TABLE 2

| | PGM | $\overline{PGM}$ | RD | VERI | ER | SS |
|---|---|---|---|---|---|---|
| Reading | L | H | H | L | L | 0 |
| Writing | H | L | L | L | L | 0 |
| Erasing | H | L | L | L | H | $Vpp-V_{TN}$ |
| Erase Verify | L | H | H | H | L | 0 |

The above mentioned example is such that the flash EEPROM is controlled on the basis of the external control signals CE, $\overline{WE}$, OE, and $\overline{EE}$, but this merely a simple example. The flash EEPROM can be controlled by other signals, or in a program stored in a ROM provided in the same chip. But, the following description is based on an example in which the various modes are controlled on the basis of the external control signals CE, $\overline{WE}$, OE, and $\overline{EE}$ and the high voltage Vpp.

For simplification of the following description, all N-channel enhancement MOS (metal-oxide-semiconductor) transistors, abbreviated as "NE-MOST", have the same threshold $V_{TN}$, and all N-channel MOS transistors having a substrate threshold, abbreviated as "NO-MOST", have the same threshold $V_{TO}$. In addition, all P-channel enhancement MOS transistors, abbreviated as "PE-MOST", have the same threshold $V_{TP}$. Furthermore, unless an additional remark is given, it should be understood that a substrate of the PE-MOST is connected to the voltage supply terminal Vcc, and the substrates of the NE-MOST and the NO-MOST are connected to the ground terminal GND.

Figure 2:
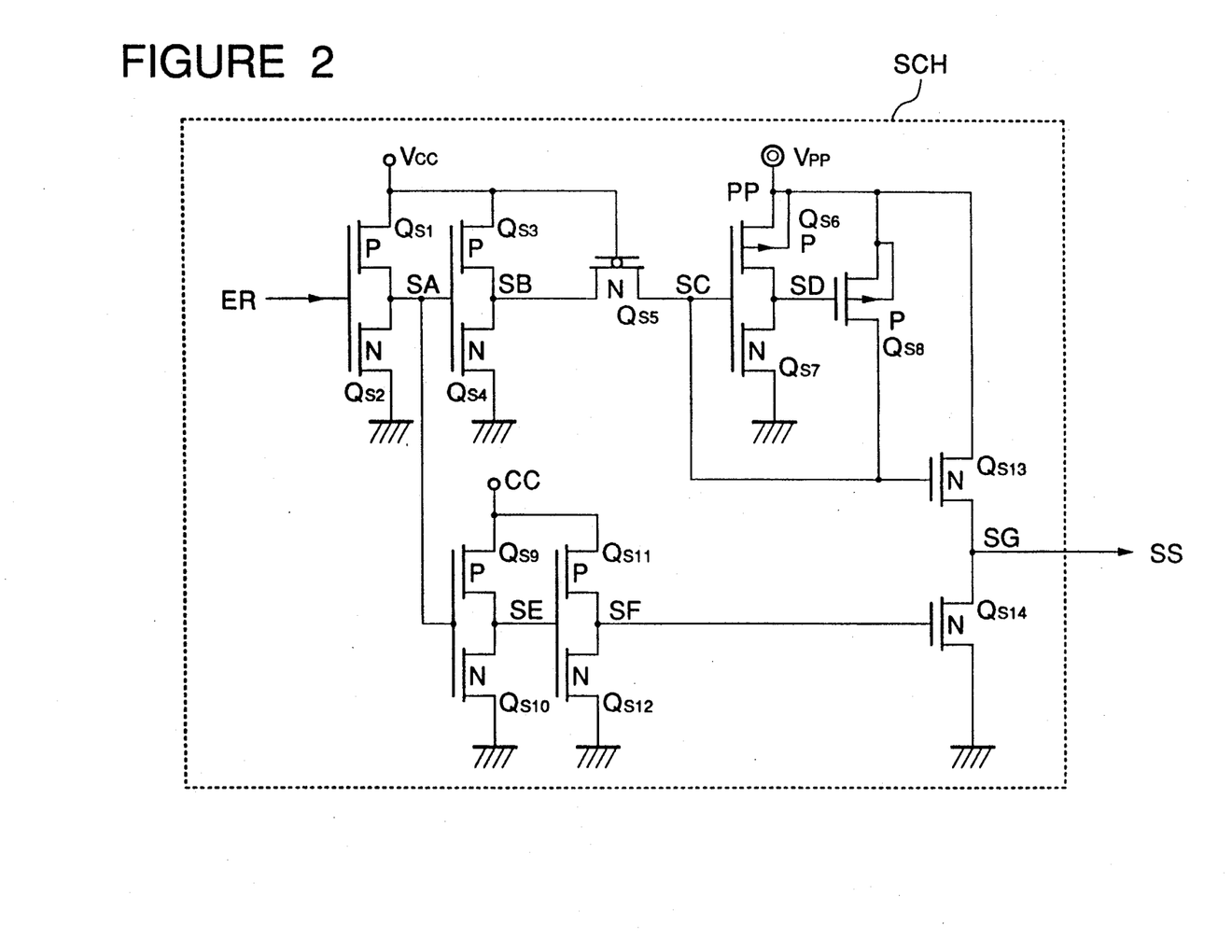
FIG. 2 is a circuit of one example of the source voltage switching circuit incorporated in the nonvolatile semiconductor memory shown in FIG. 1.

Referring to FIG. 2, there is shown a circuit of one example of the source voltage switching circuit SCH, which includes PE-MOSTs $Q_{s1}, Q_{s3}, Q_{s9}$ and $Q_{s11}$, PE-MOSTs $Q_{s6}$ and $Q_{s8}$ having their substrate connected to the signal line PP, NE-MOSTs $Q_{s2}, Q_{s4}, Q_{s7}, Q_{s10}, Q_{s12}, Q_{s13}$ and $Q_{s14}$, and NO-MOST $Q_{s5}$, connected as shown.

As mentioned in the above table 2, the erase signal ER is at a high level H in an erase mode, and at a low level L in the other modes. When the erase signal ER is at the high level, a node SC is charged up to a level of $(Vcc-V_{TO})$, but a W/L ratio (a ratio of gate width to gate length) of the PE-MOST $Q_{s6}$ and the NE-MOST $Q_{s7}$ is so designed to ensure that a logic threshold of an inverter composed of the PE-MOST $Q_{s6}$ and the NE-MOST $Q_{s7}$ is lower than the level of $(Vcc-V_{TO})$.

As shown in the above table, in the erasing mode, the output voltage SS is brought to $(Vpp-V_{TN})$ since the NE-MOST $Q_{s13}$ is turned on and the NE-MOST $Q_{s14}$ is turned off. In the other modes, since the NE-MOST $Q_{s13}$ is turned off and the NE-MOST $Q_{s14}$ is turn ed on, the output voltage SS is brought to 0 V.

Figure 3:
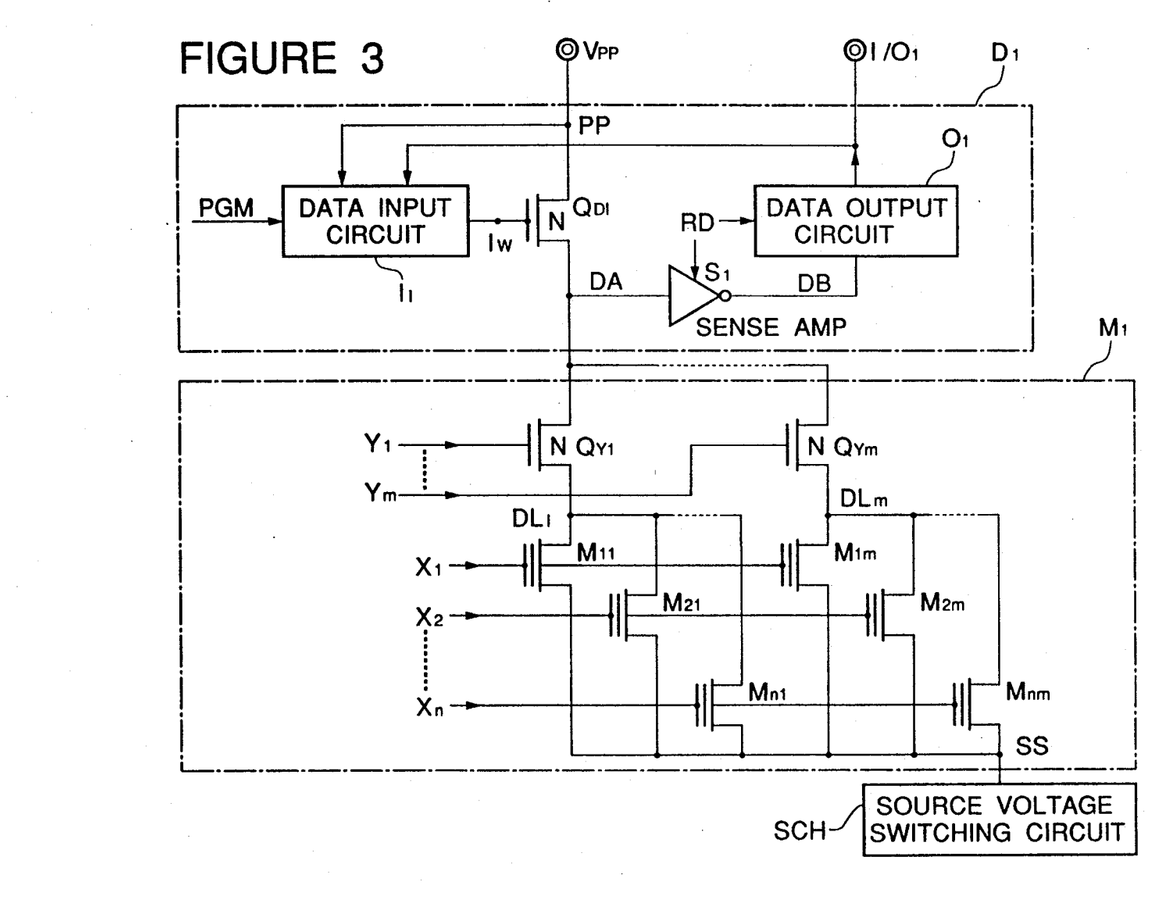
FIG. 3 is a circuit diagram of an example of the data input/output circuit and the memory array incorporated in the nonvolatile semiconductor memory shown in FIG. 1.

Turning FIG. 3, there is shown a circuit diagram of an example of the data input/output circuit $D_1$ and the memory array $M_1$. The data input/output circuit $D_1$ includes a data input circuit $I_1$, which is controlled by the write signal PGM and data supplied from the associated input/output terminal $I/O_1$. In the reading mode and in the erase verify mode, the data input circuit $I_1$ is controlled to bring its output $I_W$ to the low level L, and in the erase mode, as shown in the above mentioned table 2, since "1" is applied to the associated input/output terminal $I/O_1$, the output $I_W$ of the data input circuit $I_1$ is brought to the low level L. In the write mode, when "0" is applied to the associated input/output terminal $I/O_1$, the data input circuit $I_1$ is controlled to bring its output $I_W$ to Vpp, and when "1" is applied to the associated input/output terminal $I/O_1$, the data input circuit $I_1$ is controlled to bring its output $I_W$ to the low level L.

The output $I_W$ of the data input circuit $I_1$ is connected to a gate of an NE-MOST $Q_{D1}$ for writing, which is connected between the line PP and a node DA connected to the input/output of the corresponding memory array.

The node DA is also connected to an input of a sense amplifier $S_1$, which is controlled by the read signal RD to be rendered active in the reading mode and in the erase verify mode so as to amplify an voltage on digit lines $DL_1, \ldots, DL_m$ changing dependently upon a content of a selected memory cell. An output of the sense amplifier $S_1$ is connected to a data output circuit $O_1$, which is also controlled by the read signal RD to be rendered active in the reading mode and in the erase verify mode so as to transfer the output of the sense amplifier to the input/output terminal $I/O_1$.

The memory array $M_1$ includes "m" NE-MOSTs $QY_1, \ldots, QY_m$ having their gates connected to the data lines or Y select lines $Y_1, \ldots, Y_m$, respectively. These NE-MOSTs $QY_1, \ldots, QY_m$ are connected between the common node DA and corresponding digit lines $DL_1, \ldots, DL_m$ and operate to determine a Y address of the memory cell to be accessed, so that a selected digit line is connected to the common node DA connected to the sense amplifier. Each of the digit lines $DL_1, \ldots, DL_m$ is connected to "n" memory cells $M_{1i}$ to $M_{ni}$ (i=1 to m) of for example a floating gate type, which receive at their gates the word lines $X_1$ to $X_n$, respectively.

Now, operation of the flash type EEPROM in the erase mode, in the write mode and in the reading mode will be explained with reference to the Tables 1 and 2 and FIGS. 1 to 3.

(1) Erase mode

As mentioned above, the output $I_W$ of the data input circuit $I_1$ is brought to the low level L, so that the NE-MOST $Q_{D1}$ is turned off. In addition, it is controlled so that all the outputs $Y_1$ to $Y_m$ of the Y decoder YD and all the outputs $X_1$ to $X_n$ of the X decoder are br ought to the low level L. When the erase signal ER is changed from the low level L to the high level H, the output SS of the source voltage switching circuit SCH connected to the common source nodes of the memory cells is charged from 0 V to $(V_{pp}-V_{TN})$. As a result, a high electric field is applied between a gate and a source of each memory cell, so that electric charge injected into a floating gate of the memory cell is discharged to the source. Accordingly, all of the memory cells are simultaneously erase d.

Thus, the threshold voltage of the memory cell is lowered. A threshold $V_{TM}$ (E) of the erased memory cell is set at a level between 0 V and Vcc, which enables or ensures, in the reading mode, to turn on the erased memory cell which is selected but to maintain off the erased memory cell which is not selected. In this case, the time length $t_{PE}$ of the erasing operation is determined by a width of the erase signal ER. In the following, it is assumed that when the erased memory cell is selected, the data "1" is outputted from the input/output terminal I/Oi.

(2) Write mode

When the memory cell is written, "0" is inputted to the input/output terminal I/Oi, and the high voltage Vpp is applied to the output Iw of the data input circuit $I_1$ so that the NE-MOST $Q_{D1}$ is turned on.

At this time, for example, if the memory cell $M_{11}$ is selected, both of the Y select or data line $Y_1$ and the word line $X_1$ are brought to the high voltage Vpp, and the other data lines and the other word lines are maintained at the low level L. Therefore, a write current flows from the terminal Vpp through the NE-MOST $Q_{D1}$ and the NE-MOST $Q_{Y1}$ to the memory cell $M_{11}$, so that a voltage is applied to the digit line $DL_1$. As a result, hot electrons are generated, so that electrons are injected to the floating gate of the memory. With this action, the threshold of the memory cell is raised. The threshold of the written memory cell is set to a level ensuring that the written memory cell selected in the read mode is maintained off, namely at a level higher than the voltage supply voltage Vcc applied when the flash EEPROM is operated.

On the other hand, if the memory cell is not written, "1" is supplied to the input/output terminal I/Oi, and therefore, the NE-MOST $Q_{D1}$ is maintained off. Accordingly, the writing operation is not executed for the memory cell. In the following, it is assumed that when the written memory cell is selected, the data "0" is outputted from the input/output terminal I/Oi.

(3) Reading mode

As mentioned above, the NE-MOST $QD_1$ is turned off, and the sense amplifier $S_1$ and the data output circuit $O_1$ are rendered active.

At this time, assuming that the memory cell $M_{11}$ is selected, the Y select or data line $Y_1$ and the word line $X_1$ are brought to the voltage Vcc, and the other data lines and the other word lines are brought to the low level L. If the memory cell $M_{11}$ is in the written condition, the memory cell is maintained off, so that the digit line $DL_1$ is charged, and therefore, "0" is outputted from the input/output terminal $I/O_1$.

On the other hand, if the memory cell $M_{21}$ is selected, the Y select or data line $Y_1$ and the word line $X_2$ are brought to the voltage Vcc, and the other data lines and the other word lines are brought to the low level L. If the memory cell $M_{21}$ is the erased condition, the memory cell is turned on, so that the digit line $DL_1$ is discharged, and therefore, "1" is outputted from the input-/output terminal $I/O_1$.

Figure 4:
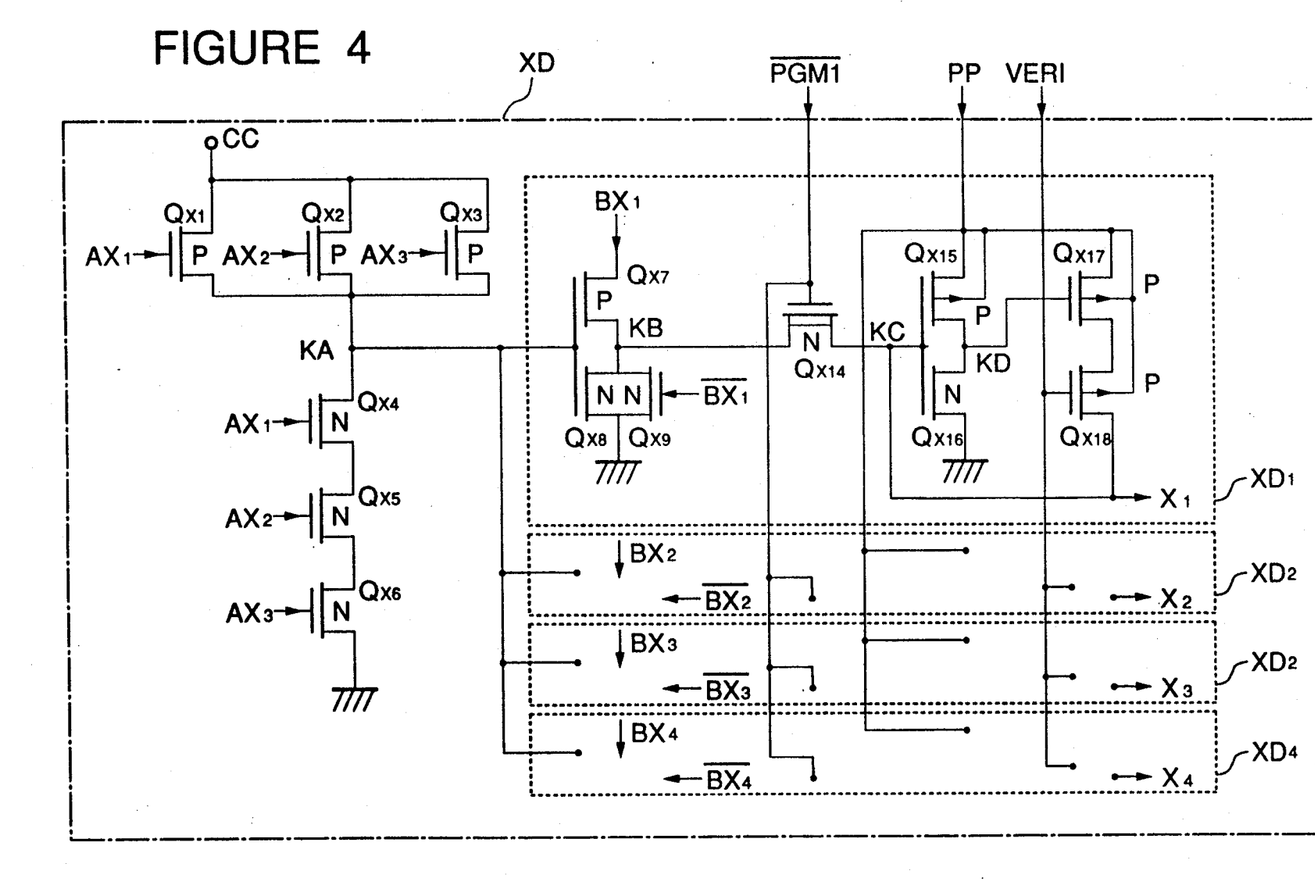
FIG. 4 is a circuit diagram of one example of the X decoder incorporated in the nonvolatile semiconductor memory shown in FIG. 1.

Referring to FIG. 4, there is shown a circuit diagram of an first example of the X decoder XD incorporated in the EEPROM shown in FIG. 1.

The X decoder XD is controlled and operates in accordance with the following table 3:

TABLE 3

| | BXi (selected) | $\overline{BX}_i$ (non-selected) | Xi (selected) | $\overline{X}_i$ (non-selected) | $\overline{PGM1}$ |
|---|---|---|---|---|---|
| Reading | Vcc | 0 | Vcc | 0 | H |
| Writing | Vcc | 0 | Vpp | 0 | L |
| Erasing | 0 | Vcc | 0 | 0 | L |
| Erase Verify | Vcc | 0 | $|V_{TD1}|$ | 0 | L |

As shown in the Table 3, the line PP is connected to the high voltage terminal Vpp supplied with the voltage supply voltage Vcc in the reading mode and the high voltage Vpp in the other modes. The verify signal VERI is brought to the high level H in the erase verify mode and to the low level L in the other modes. The signal PGM1 is brought to the high level H in the reading mode, and to the low level L in the erase verify mode. In the write mode and in the erase mode, the signal $\overline{PGM1}$ is brought to the high level H during an address setting period, and to the low level L after the address setting period.

The X decoder XD includes PE-MOSTs $Q_{X1}$, $Q_{X2}$, $Q_{X3}$ and $Q_{X7}$, NE-MOSTs $Q_{X4}$, $Q_{X5}$, $Q_{X6}$, $Q_{X8}$, $Q_{X9}$ and $Q_{X16}$, ND-MOST (N-channel depletion MOS transistor), $Q_{X14}$ having a threshold $V_{TD}$ of $-3$ V in the shown embodiment, and PE-MOSTs $Q_{X15}$, $Q_{X17}$ and $Q_{X18}$ having the substrate connected to the line PP, which are connected as shown. A circuit composed of $Q_{X7}$, $Q_{X8}$, $Q_{X9}$, $Q_{X14}$, $Q_{X15}$, $Q_{X16}$, $Q_{X17}$ and $Q_{X18}$ is provided one for each of the word lines, and is designated by DXi (i=1 to n) and a circuit composed of $Q_{X1}$, $Q_{X2}$, $Q_{X3}$, $Q_{X4}$, $Q_{X5}$ and $Q_{X6}$ is provided in common to the circuits $XD_1$ to $XD_4$.

The address signals AX1, AX2 and AX3 outputted from the address buffer AD are supplied to gates of $Q_{X1}$, $Q_{X2}$ and $Q_{X3}$, respectively, and also supplied to gates of $Q_{X4}$, $Q_{X5}$ and $Q_{X6}$, respectively. $BX_1$, $BX_2$, $BX_3$, $BX_4$, $BX_1$, $\overline{BX_2}$, $BX_3$ and $\overline{BX_4}$ are outputs of an X predecoder (not shown). $BX_1$, $\overline{BX_2}$, $BX_3$ and $\overline{BX_4}$ are a logically inverted level of $BX_1$, $BX_2$, $BX_3$, $BX_4$, respectively.

The PE-MOST $Q_{X15}$ is designed to have a W/L ratio sufficiently smaller than the W/L ratio of the NE-MOST $Q_{X16}$, and an inverter composed of the PE-MOST $Q_{X16}$ and NE-MOST $Q_{X16}$ has a logical threshold voltage substantially equal to $V_{TN}$. In addition, the PE-MOST $Q_{X17}$ is designed to have a W/L ratio sufficiently smaller than the W/L ratios of the PE-MOST $Q_{X18}$, the ND-MOST $Q_{X14}$ and the NE-MOSTs $Q_{X8}$ and $Q_{X9}$. A current flowing through the PE-MOSTs $Q_{X17}$ and $Q_{X18}$ is determined by a current drive power of the PE-MOST $Q_{X17}$.

Each of the circuits XDi can be divided into a first circuit composed of the PE-MOST $Q_{X7}$ and the NE-MOSTs $Q_{X8}$ and $Q_{X9}$ and operates to charge an output node KB to the voltage supply voltage Vcc when it is selected by the address input, a first MOS transistor of the depletion type composed of the ND-MOST $Q_{X14}$ connected between the output node KB of the first circuit and the word line, for example, $X_1$, and having the gate connected to receive the signal $\overline{PGM1}$, a second circuit composed of the PE-MOSTs $Q_{X15}$ ans $Q_{X17}$ and the NE-MOST $Q_{X16}$ for generating the high voltage in the write mode, and a second MOS transistor of the enhancement type composed of the PE-MOST $Q_{X18}$ and connected between the output of the second circuit and the word line, for example, $X_1$, and having a gate connected to receive the erase verify signal VERI.

Now, operation of the X decoder will be described:

(1) Erasing mode

As mentioned hereinbefore, since all the outputs $AX_1$, $AX_2$ and $AX_3$ of the address buffer AD are brought to the low level L, the NE-MOST $Q_{X8}$ is turned on. Here, since the W/L ratio of the PE-MOST $Q_{X17}$ is designed to be sufficiently smaller than the W/L ratio of the ND-MOST $Q_{X14}$ and the NE-MOST $Q_{X8}$, the word line $X_1$ is brought to 0 v. Similarly, the other word lines $X_2$ to Xn are brought to 0 V.

(2) Write mode

If the word line $X_1$ is selected, all the outputs $AX_1$, $AX_2$ and $AX_3$ of the address buffer AD are brought to the high level H. The X predecoder output $BX_1$ is brought to the high level H, and the X predecoder outputs $BX_2$, $BX_3$ and $BX_4$ are brought to the low level L. Accordingly, the X predecoder output $\overline{BX_1}$ is brought to the low level L, and the X predecoder outputs $BX_2$, $\overline{BX_3}$ and $\overline{BX_4}$ are brought to the high level H. Therefore, the PE-MOST $Q_{X7}$ is turned on, and the NE-MOSTs $Q_{X8}$ and $Q_{X9}$ are turned off.

In the address setting period, since the signal $\overline{PGM1}$ is brought to the high level H, and the potential Vpp of the line PP is equal to Vcc, the nodes KB and KC are charged to Vcc. Therefore, a potential of the node KC is inverted by an inverter composed of the PE-MOST $Q_{X15}$ and the NE-MOST $Q_{X16}$, so that the node KD is changed from the high level H to the low level L. Therefore, since the PE-MOST $Q_{X17}$ is turned on, so that electric charges is supplied from the line PP to the word lines $X_1$.

After the address setting period, since the signal $\overline{PGM1}$ is brought from the high level H to the low level, and the potential of the line PP is brought from the voltage supply voltage Vcc to the high voltage Vpp. At this time, a bias of (−Vcc) is applied between the gate of the ND-MOST $Q_{X14}$ and the node KB. Assuming Vcc=5 V, the ND-MOST $Q_{X14}$ is turned off, and on the other hand, the node KC is charged from Vcc to Vpp through the PE-MOSTs $Q_{X17}$ and $Q_{X18}$, so that the voltage of the word line $X_1$ is equilibrated at the voltage Vpp.

On the other hand, if the word line $X_1$ is not selected, the PE-MOST $Q_{X7}$ is maintained off, and the NE-MOSTs $Q_{X8}$ and ND-MOST $Q_{X9}$ are turned on, so that the nodes KB and KC are discharged to 0 V. On the other hand, the node KD is brought to Vcc, so that the PE-MOST $Q_{X17}$ is turned off. In this condition, the address setting period terminates.

After the address setting period, although the signal $\overline{PGM1}$ is brought from the high level H to the low level, since the ND-MOST $Q_{X14}$ is of the depletion type, the ND-MOST $Q_{X14}$ is maintained in the on condition. Therefore, the node KC is still maintained at 0 V. Accordingly, the potential of the node KD is elevated in accordance with the elevation of the voltage of the line PP. Thus, the PE-MOST $Q_{X17}$ is still maintained off, so that the voltage of the word line $X_1$ is equilibrated at 0 V.

(3) Reading mode

The X decoder XD operates in the same manner as the operation during the address setting period of the writing mode. The word line $X_1$ is charged to Vcc if it is selected and discharged to 0 V if it is not selected.

(4) Erase verify mode

The signal $\overline{PGM1}$ is set to the low level L, and the verify signal VERI is set to the high level H. The high voltage terminal Vpp connected to the line PP is applied with Vcc.

If the word line $X_1$ is selected, the PE-MOST $Q_{X7}$ is turned on, and the NE-MOSTs $Q_{X8}$ and $Q_{X9}$ are turned off, similarly to the reading mode. Therefore, the node KB is charged to Vcc. At this time, the node KC is charged, but since the ND-MOST $Q_{X14}$ is designed to have the threshold of −3 V, the node KC is charged only to 3 V.

As mentioned hereinbefore, since the threshold of the inverter composed of the PE-MOST $Q_{X15}$ and NE-MOST $Q_{X16}$ is designed to be about $V_{TN}$, the potential of the node KD is changed from the high level H to the low level L, so that the PE-MOST $Q_{X17}$ is turned on. However, since the PE-MOST $Q_{X18}$ is off, the selected word line Xi is applied with only 3 V in this embodiment.

Namely, assuming that the threshold of the ND-MOST $Q_{X14}$ is expressed by $V_{TD1}$, the voltage of the word line selected in the erase verify mode is given by $|V_{TD1}|$. Therefore, the erase verify voltage $V_{EV1}$ corresponds to this voltage, as follows:

$$V_{EV1} = |V_{TD1}|.$$

If the word line $X_1$ is not selected, the PE-MOST $Q_{X7}$ is off, and the NE-MOSTs $Q_{X8}$ and $Q_{X9}$ are on, similarly to the corresponding situation of the reading mode. Therefore, the nodes KB and KC are discharged to 0 V.

As mentioned above, in the erase verify mode, the selected word line is applied with the erase verify voltage $|V_{TD1}|$ and the non-selected word lines are applied with 0 V.

Accordingly, by incorporating the X decoder shown in FIG. 4 into the flash type EEPROM, it is possible to precisely check whether or not the erasing of the memory cells is satisfactorily completed, by setting the erase verify mode after the erase mode.

In addition, the X decoder shown in FIG. 4 makes unnecessary the erase verify voltage generation circuit and the associated voltage switching circuit, which have been required in the conventional EEPROM, and in addition, makes unnecessary the reference voltage generator which has been provided in the conventional EEPROM.

As mentioned above, the erase verify voltage in the embodiment is determined by a voltage by which the node KC (the source of the ND-MOST $Q_{X14}$) is charged and by which the ND-MOST $Q_{X14}$ is cut off.

The ND-MOST $Q_{X14}$ has a channel formed by previously implanting ions such as $^{31}P^+$ in the manufacturing process (N+ buried channel). When the source is charged so that a reverse bias is applied between a gate and a drain, a depletion layer extends from the substrate surface and a boundary of a source junction to the channel region, and consequently, the channel is cut off. The above mentioned $|V_{TD1}|$ corresponding to the erase verify voltage corresponds to a source voltage at which the channel is cut off.

An extension $l_d$ of the depletion layer from the substrate surface is expressed as follows: (See Furukawa and Matsumura "Electronic Device", pp152–152, 1979, November, Shoko-Do).

$$l_d = \{[2\epsilon_r\epsilon_o(2\phi_F + V_{kc})]/qNc\}^{\frac{1}{2}} \quad (1)$$

where

Nc is concentration of doped donors
$\phi_F$ is Fermi level of P-type substrate
$V_{kc}$ is voltage of the node KC (source)
$\epsilon_o$ is dielectric constant in vacuum
$\epsilon_r$ is relative dielectric constant.

The channel of the ND-MOST $Q_{X14}$ is formed in the previously formed N+ buried channel. If the depletion layer reaches a bottom of the N+ buried channel, the N+ buried channel is cut off, and therefore, the ND-MOST $Q_{X14}$ is cut off.

By modifying the equation (1) and assuming that the voltage of the node KC required for cutting off the channel is $|V_{TD1}|$, $|V_{TD1}|$ can be expressed as follows:

$$|V_{TD1}| = \{(qNc\ l_d^2)/2\epsilon_r\epsilon_o\} - 2\phi_F \quad (2).$$

Here, if it is set that $q = 1.6 \times 10^{-19}$ [C], $Nc = 1.22 \times 10^{23}$ [m$^{-3}$], $l_d = 0.2 \times 10^{-6}$[m], $\epsilon_o = 8.854 \times 10^{-12}$[F/m], $\epsilon_r = 11.8$, and $\phi_F = 0.35$, it becomes $|V_{TD1}| = 3.0$ V. Accordingly, the erase verify voltage can set to 3.0 V.

As seen from the equation (2), the erase verify voltage is determined by physical parameters, and therefore, is remarkably stable against variations of process parameters, in comparison with that of the conventional EEPROM. In addition, the Fermi level $\phi_F$ varies due to change of temperature. However, assuming that the temperature changes from 25° C. to −75° C., the change of the Fermi level $\phi_F$ is only about 0.09 V under the concentration of Nc = $1.22 \times 10^{23}$ [m$^{-3}$] (See S.M.Sze "Physics of Semiconductor Device", p37, JOHN WILEY & SONS). Therefore, the erase verify voltage is very stable against variations of temperature, in comparison with that of the conventional EEPROM.

Figure 7:
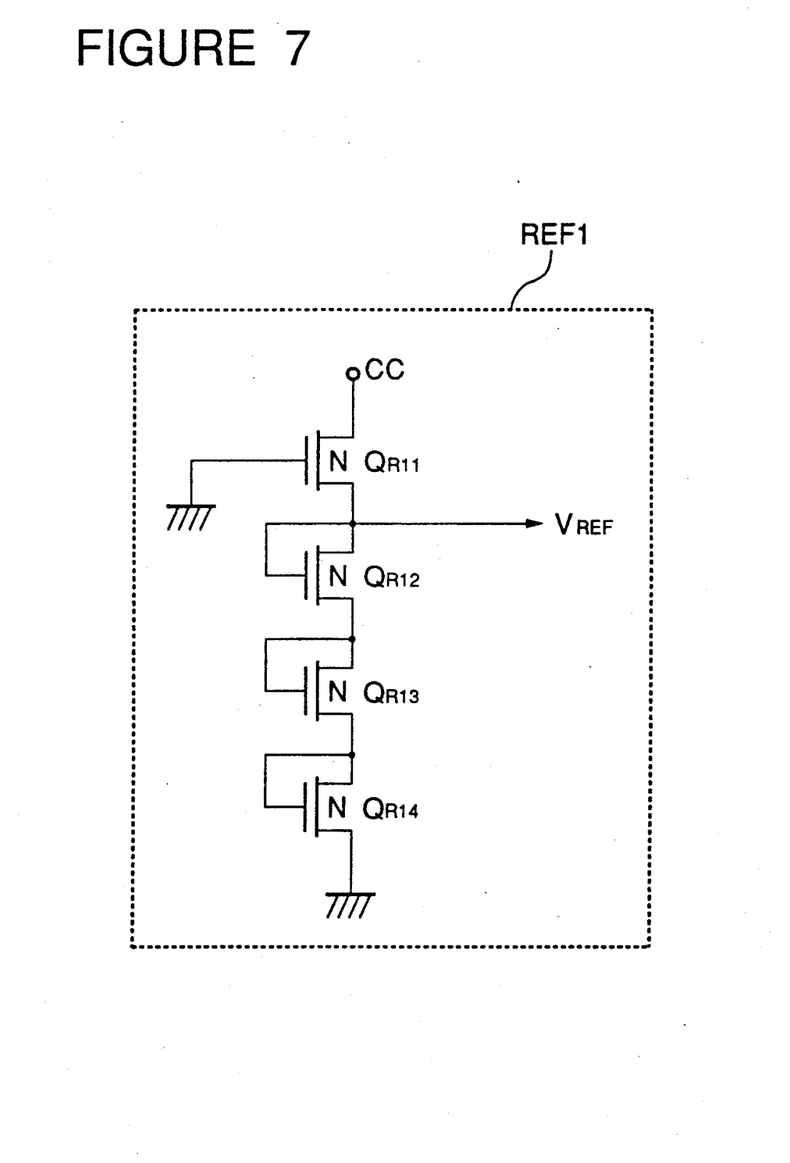
FIG. 7 shown a circuit diagram of the conventional reference voltage generating circuit.

Turning to FIG. 7, there is shown a circuit diagram of the conventional reference voltage generating circuit mentioned hereinbefore. This reference voltage generating circuit is composed of one PE-MOST $Q_{R11}$ and three NE-MOSTs $Q_{R12}$, $Q_{R13}$ and $Q_{R14}$ connected in series. Each of the MOS transistors is connected in the form of active load. Namely, a gate and a drain of each of NE-MOSTs $Q_{R12}$, $Q_{R13}$ and $Q_{R14}$ are short-circuited, and a gate of the PE-MOST $Q_{R11}$ is grounded. A source of the PE-MOST $Q_{R11}$ is connected to the voltage supply voltage line CC, and a drain of the PE-MOST $Q_{R11}$ is connected to a drain of the first NE-MOST $Q_{R12}$. A source of the third NE-MOST $Q_{R14}$ is grounded. A connection node between the drain of the PE-MOST $Q_{R11}$ and the drain of the first NE-MOST $Q_{R12}$ gives the reference voltage Vref.

Figure 5A:
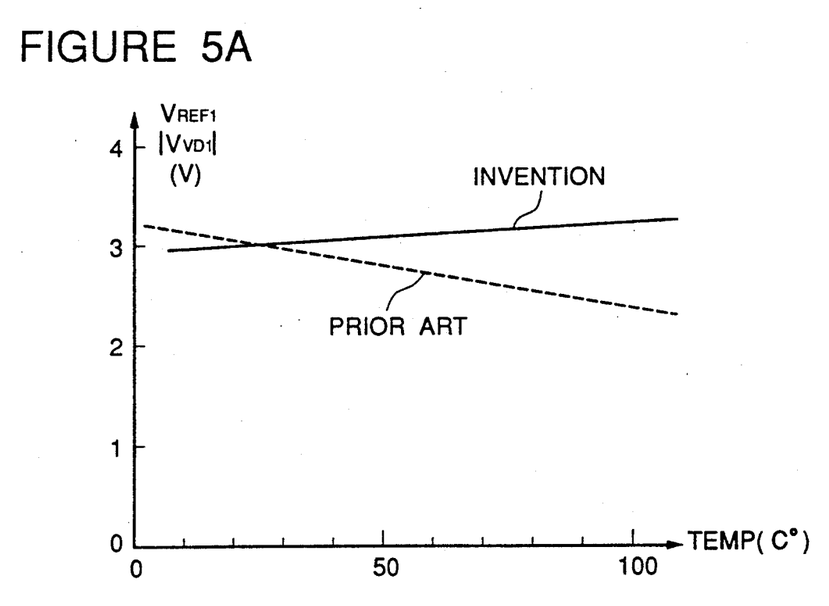
FIG. 5A is a graph illustrating a relation between the erase verify voltage and the temperature.

Referring to FIG. 5A, there is shown a temperature characteristics of $|V_{TD1}|$ generated in the X decoder shown in FIG. 4 designed to give $|V_{TD1}| = 3.0$ V and the reference voltage Vref generated by the conventional reference voltage generating circuit shown in FIG. 7 designed to give Vref = 3.0 V. It is apparent from FIG. 5A that the erase verify voltage generated in the X decoder shown in FIG. 4 is very stable against variations of temperature.

Accordingly, even if the process parameters are more or less deviated from the designed values, the EEPROM in accordance with the present invention can precisely detect the threshold of the erased memory cells over a wide temperature range.

Figure 5B:
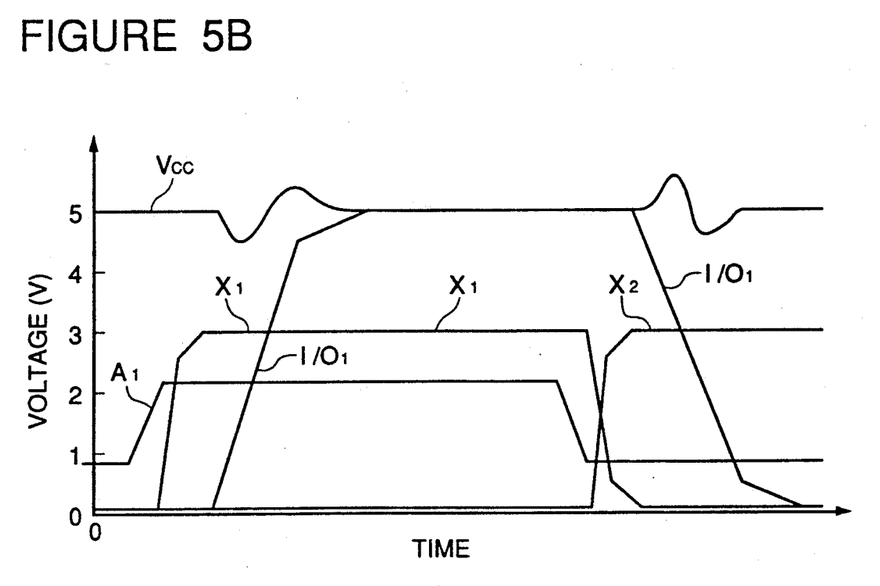
FIG. 5B is a waveform diagram illustrating an operation of the erase verify mode.

Referring to FIG. 5B, the various waveforms of the voltage supply voltage Vcc, the voltage of the selected word line X1, and the voltage of the input/output terminal I/O$_1$ in the erase verify mode in the EEPROM in accordance with the first embodiment as mentioned above are illustrated.

When the erase verify mode is set after completion of the erasing, the address signal A$_1$ is changed from the low level L to the high level H, and the word line X$_1$ is charged and elevated from 0 V until the erase verify voltage V$_{EV1}$ becomes equal to $|V_{TD1}|$. Here, assume that the ND-MOST $Q_{X14}$ is designed to give $|V_{TD1}| = 3.0$ V, and the erased memory cell selected at this time has the threshold of V$_{TN}$(E) = 2.7 V. The selected memory cell is turned on, so that the completion of erasing is detected, and therefore, the input/output terminal I/O$_1$ is changed from the low level L to the high level H. As a result, a large charge/discharge current flows into the memory array through the input/output terminal I/O$_1$ so that the voltage supply voltage Vcc momentarily lowers. At this time, as seen from the equation (2), the value of $|V_{TD1}|$ is not influenced by the variation of the voltage supply voltage Vcc. Therefore, even if the voltage supply voltage Vcc changes from 5 V to 4.5 V, the $|V_{TD1}|$ is maintained at 3.0 V. Accordingly, the reading of the memory cell never becomes unstable due to the variation of the voltage supply voltage Vcc, and the input/output terminal I/O$_1$ is equilibrated at Vcc.

Thereafter, the X address is changed so that the word line X$_1$ is changed from the high level H to the low level L and the word line X$_2$ is changed from the low level L to the high level H, so that the word line X$_2$ is charged and elevated from 0 V to $|V_{TD1}|$. Here, assume the erased memory cell selected at this time has the threshold of V$_{TN}$(E) = 3.3 V. The selected memory cell is off, so that the incompletion of erasing is detected, and therefore, the input/output terminal I/O$_1$ is changed from the high level H to the low level L. As a result, a large charge/discharge current flows out of the memory array through the input/output terminal I/O$_1$ so that the voltage supply voltage Vcc momentarily elevates. At this time, as seen from the equation (2), the value of $|V_{TD1}|$ is not influenced by the variation of the voltage supply voltage Vcc. Even in this situation, as mentioned hereinbefore, since $|V_{TD1}|$ does not depend upon the voltage supply voltage Vcc, the reading of the memory cell can be stably performed, and the input/output terminal I/O$_1$ is equilibrated at 0 V.

As mentioned above, the flash type EEPROM of the first embodiment has the erase verify voltage $|V_{TD1}|$ independent of the voltage supply voltage Vcc. Therefore, even if the voltage supply voltage Vcc varies due to the switching and/or others, it is possible to precisely detect whether or not the threshold voltage of the erased memory cell is less than a predetermined voltage level.

In the X decoder XD shown in FIG. 4, a circuit for selecting one word line is constituted of 3 NAND circuits+inverter. However, the present invention can be applied to any circuit capable of selecting one word line. In addition, the transistor $Q_{X18}$ has been formed of PE-MOST, but can be formed of NE-MOST or NO-MOST.

Figure 6:
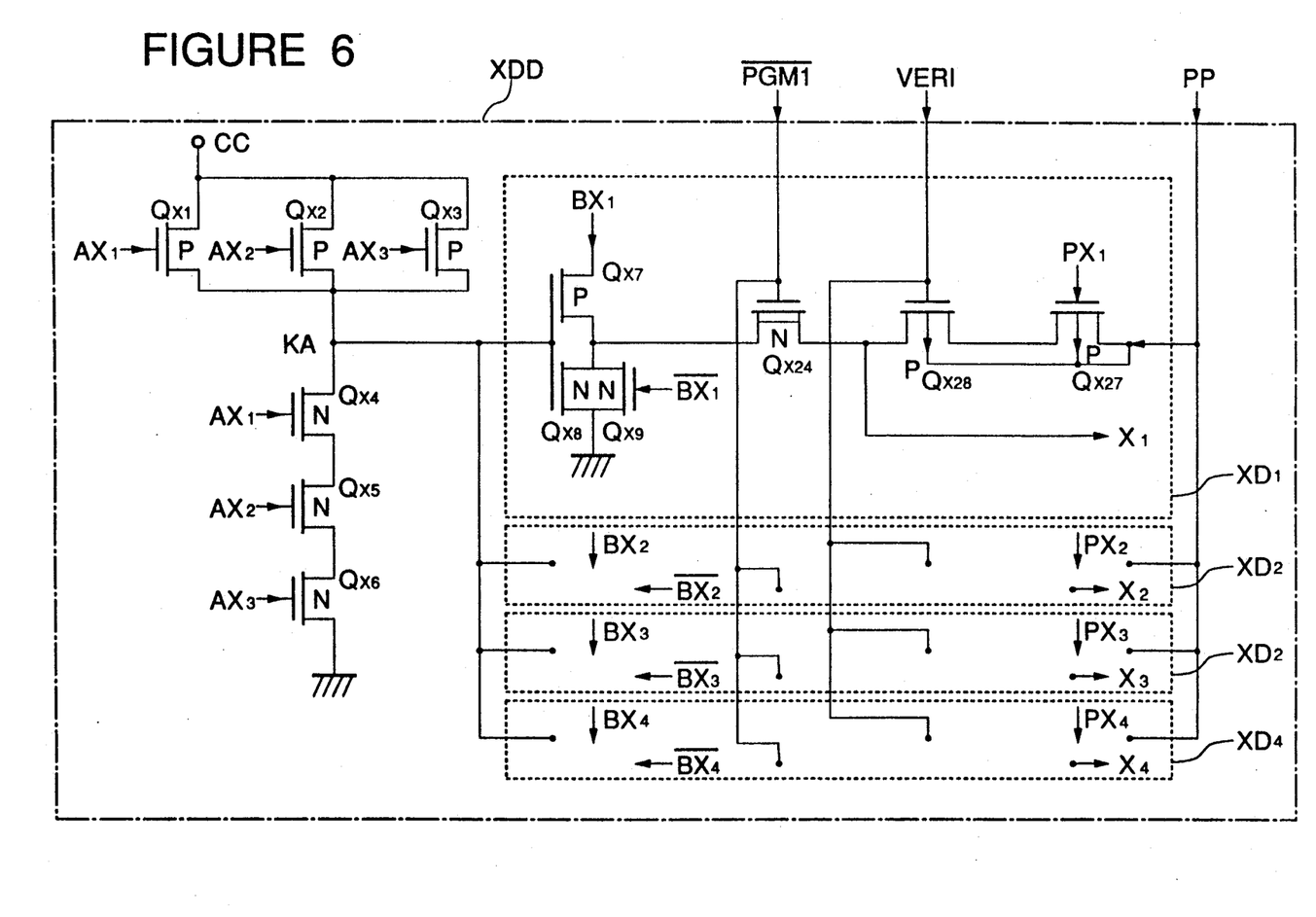
FIG. 6 is a circuit diagram of another example of the X decoder incorporated in the nonvolatile semiconductor memory shown in FIG. 1.

Turning to FIG. 6, there is shown another example of the X decoder XD incorporated in the EEPROM. The second example of the X decoder will be designated by XDD hereinafter. The following TABLE 4 shows the operation condition of the X decoder XDD.

TABLE 4

|  | BXi (selected) | $\overline{BX}_i$ (non-selected) | PXi (selected) | PXi (non selected) | Xi (selected) | Xi (non-selected) |
|---|---|---|---|---|---|---|
| Reading | Vcc | 0 | 0 | Vcc | Vcc | 0 |
| Writing | Vcc | 0 | 0 | Vpp | Vpp | 0 |
| Erasing | 0 | Vcc | 0 | Vpp | 0 | 0 |
| Erase Verify | Vcc | 0 | 0 | Vpp | $|V_{TD1}|$ | 0 |

In FIG. 6, elements similar to those shown in FIG. 4 are given the same Reference Signs, and explanation thereof will be omitted.

$Q_{X24}$ is ND-MOST, and $Q_{X27}$ and $Q_{X28}$ are PE-MOST having the substrate connected to Vpp. $Q_{X24}$, $Q_{X27}$ and $Q_{X28}$ are designed to have the same R/L ratio as those of the ND-MOST $Q_{X14}$, the PE-MOSTs $Q_{X17}$ and $Q_{X18}$, respectively. PX$_1$, PX$_2$, PX$_3$ and PX$_4$ are outputs of X subdecoders (not shown). As shown in the TABLE 4, PX$_1$, PX$_2$, PX$_3$ and PX$_4$ are brought to 0 V if it is selected, and to Vcc if it is not selected in the read mode. In the other modes, PX$_1$, PX$_2$, PX$_3$ and PX$_4$ are brought to the high voltage Vpp if it is not selected.

In the second example XDD of the X decoder, the first circuit is composed of PE-MOST $Q_{X7}$ and NE-MOST $Q_{X8}$ and $Q_{X9}$, and the first MOS transistor is formed of ND-MOST $Q_{X24}$. In addition, the second circuit is composed of PE-MOST $Q_{X27}$, and the second MOS transistor is formed of PE-MOST $Q_{X28}$.

If ND-MOST $Q_{X24}$ is designed to have the same threshold as that of ND-MOST $Q_{X14}$ of the first example XD of the X decoder shown in FIG. 4, the second example XDD of the X decoder operates in the same manner as that of the first example XD of the X decoder, in the respective modes, excluding the fact that the selected word line is charged through PE-MOST $Q_{X27}$ and PE-MOST $Q_{X28}$.

As seen from the above, since the non-volatile semiconductor memory constituted of the flash type EEPROM in accordance with the present invention is such that the erase verify voltage is determined by the threshold $|V_{TD1}|$ of the depletion MOS transistor used in the X decoder, the following advantages can be obtained (1) Since the value of $|V_{TD1}|$ is almost not changed due to variations of process parameters, temperature variation, and fluctuation of voltage supply voltage. In the erase verify mode performed after completion of the erasing, it is possible to precisely detect whether or not the threshold of the erased memory cell becomes less than a predetermined reference level.

(2) The reference voltage generating circuit, the erase verity voltage generating circuit and the voltage switching circuit, which have been required in the prior art, becomes unnecessary. Therefore, the circuit can be simplified, and the manufacturing process is also simplified.

Therefore, the present invention can make it possible to provide a flash type EEPROM having a large memory capacity and a high reliability.

The invention has thus been shown and described with reference to the specific embodiments. However, it should be noted that the present invention is in no way limited to the details of the illustrated structures but changes and modifications may be made within the scope of the appended claims.

I claim:

1. A non-volatile semiconductor memory comprising a memory cell matrix composed of a plurality of memory array including a number of memory cells having a floating gate, the memory cell matrix also including a plurality of word lines and a plurality of digit lines, an X decoder receiving a portion of an address for selecting one of the word lines, and a Y decoder receiving another portion of the address for selecting one of the digit lines, the X decoder including a first circuit for charging an output of the first circuit to a voltage when the first circuit is selected by the address, a first MOS transistor of the depletion type connected between the output node of the first circuit and a corresponding word line and having a gate connected to receive a control voltage, a second circuit for generating a high voltage at an output node of the second circuit at the time of a write mode, and a second MOS transistor of the enhancement type connected between the output node of the second circuit and the corresponding word line and having a gate connected to receive an erase verify signal.

2. A non-volatile semiconductor memory claimed in claim 1 wherein the first MOS transistor is of the N-channel type and the second MOS transistor is of the P-channel type.

3. A method for driving a non-volatile semiconductor memory comprising a memory cell matrix composed of a plurality of memory array including a number of memory cells having a floating gate, the memory cell matrix also including a plurality of word lines and a plurality of digit lines, an X decoder receiving a portion of an address for selecting one of the word lines, and a Y decoder receiving another portion of the address for selecting one of the digit lines, the X decoder including a first circuit for charging an output of the first circuit to a voltage supply voltage when the first circuit is selected by the address, a first MOS transistor of the depletion type connected between the output node of the first circuit and a corresponding word line and having a gate connected to receive a control voltage, a second circuit for generating a high voltage at an output node of the second circuit at the time of a write mode, and a second MOS transistor of the enhancement type connected between the output node of the second circuit and the corresponding word line and having a gate connected to receive an erase verify signal, the method including the steps of, in an erase voltage verify mode, bringing the gate of the first MOS transistor to a low level and bringing the second MOS transistor in an off condition, so that a selected word lines is charged through the first MOS transistor, whereby a voltage of the selected word line is set to a level lower than the voltage supply voltage.

* * * * *